(12) United States Patent
Shan

(10) Patent No.: US 11,114,055 B2
(45) Date of Patent: Sep. 7, 2021

(54) SHIFT REGISTER, DISPLAY PANEL, AND DRIVING METHOD OF SHIFT REGISTER

(71) Applicant: HKC CORPORATION LIMITED, Shenzhen (CN)

(72) Inventor: Jianfeng Shan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/040,149

(22) PCT Filed: Dec. 27, 2018

(86) PCT No.: PCT/CN2018/124214
§ 371 (c)(1),
(2) Date: Sep. 22, 2020

(87) PCT Pub. No.: WO2020/015323
PCT Pub. Date: Jan. 23, 2020

(65) Prior Publication Data
US 2021/0027734 A1 Jan. 28, 2021

(30) Foreign Application Priority Data
Jul. 17, 2018 (CN) .......................... 201810786392.7

(51) Int. Cl.
*G09G 3/36* (2006.01)
*G11C 19/28* (2006.01)
*G09G 3/3266* (2016.01)

(52) U.S. Cl.
CPC .......... *G09G 3/3677* (2013.01); *G11C 19/28* (2013.01); *G09G 3/3266* (2013.01);
(Continued)

(58) Field of Classification Search
CPC ............... G09G 3/3677; G09G 3/3266; G09G 2300/0408; G09G 2310/0286; G09G 2310/08; G09G 2320/0219; G11C 19/28
See application file for complete search history.

(56) References Cited

U.S. PATENT DOCUMENTS 10,796,780 B2 * 10/2020 Li .................... G11C 19/287
2011/0267335 A1 11/2011 Lee et al.
2020/0020266 A1 * 1/2020 Feng .................. G11C 19/28

FOREIGN PATENT DOCUMENTS

CN          1598966 A       3/2005
CN        101546545 A       9/2009
(Continued)

OTHER PUBLICATIONS

First Office Action in counterpart Chinese Application No. 201810786392.7, dated Aug. 27, 2019.
(Continued)

*Primary Examiner* — Sahlu Okebato
(74) *Attorney, Agent, or Firm* — Westbridge IP LLC

(57) ABSTRACT

Disclosed are a shift register, a display panel, and a driving method for a shift register. The driving method is applied in a display panel using a GOA technology. The display panel has a plurality of cascaded shift registers. The shift register includes an output circuit and a pull-down feedback circuit. The pull-down feedback circuit includes a first switch and a second switch. A control end of the first switch receives a quiescent point voltage signal of a subsequent stage as a feedback signal, so as to pull down the quiescent point voltage to a gate scan signal of a subsequent stage. A control end of the second switch receives a gate scan signal of a subsequent stage as a feedback signal, so as to pull down the gate scan signal of the gate line to a low preset level.

17 Claims, 7 Drawing Sheets

(52) U.S. Cl.
CPC ............... *G09G 2300/0408* (2013.01); *G09G 2310/0286* (2013.01); *G09G 2310/08* (2013.01)

(56) References Cited

FOREIGN PATENT DOCUMENTS

| | | |
|---|---|---|
| CN | 101916540 A | 12/2010 |
| CN | 106531118 A | 3/2017 |
| CN | 106910484 A | 6/2017 |
| CN | 107068093 A | 8/2017 |
| CN | 107492361 A | 12/2017 |
| CN | 107561755 A | 1/2018 |
| CN | 107871486 A | 4/2018 |
| CN | 108231021 A | 6/2018 |
| CN | 108231033 A | 6/2018 |
| CN | 108806634 A | 11/2018 |
| CN | 108831396 A | 11/2018 |
| JP | 2005128384 A | 5/2005 |
| TW | 201535975 A | 9/2015 |

OTHER PUBLICATIONS

International Search Report and Written Opinion in corresponding PCT Application No. PCT/CN2018/124214, dated Mar. 21, 2019.
Second Office Action in counterpart Chinese Application No. 201810786392.7, dated Mar. 3, 2020.
Third Office Action in counterpart Chinese Application No. 201810786392.7, dated May 27, 2020.

* cited by examiner

SHIFT REGISTER, DISPLAY PANEL, AND DRIVING METHOD OF SHIFT REGISTER

CROSS REFERENCE TO RELATED APPLICATIONS

The present disclosure is the National Stage of International Disclosure No. PCT/CN2018/124214, filed Dec. 27, 2018, which claims the benefit of Chinese Patent Application No. 201810786392.7, filed Jul. 17, 2018 with the National Intellectual Property Administration and entitled "SHIFT REGISTER, DISPLAY PANEL, AND DRIVING METHOD FOR SHIFT REGISTER", the entirety of which is hereby incorporated herein by reference.

TECHNICAL FIELD

The present disclosure relates to a display panel, and more particularly relates to a shift register in a display panel, and a driving method for a shift register.

BACKGROUND

The statement herein merely provides background information related to the present disclosure and does not necessarily constitute the existing technology.

Gate Driver on Array (GOA) technology has been widely employed in display panel industry to reduce costs of display panels. For example, a source driving IC and a gate driving IC are used as drivers in a liquid crystal display, among which the former transmits signals by controlling a voltage, and the latter controls and determines the amount of light transmission by using a transistor as a switch.

Instead of using the gate driving IC, GOA technology makes a gate driving circuit be directly formed on a glass substrate of the liquid crystal display panel. Since a plurality of logic circuits of gate shift registers which constitute the gate driving circuit are formed at an edge of the glass substrate by an exposure and development method, the costs can be reduced in terms of both the material used and the manufacturing process. In addition, a narrower frame of the liquid crystal display panel can also be achieved.

The GOA technology is developed from the Thompson circuit. Generally, in order to realize a smooth driving, a quiescent point voltage signal is precharged to a higher level, so that the precharged quiescent point voltage signal can be coupled with a clock signal into an ideal signal waveform. Thereby, when the transistor switch is turned on, a gate scan signal required for a gate line can be smoothly transmitted.

In addition, an error-proof charging time (gate Tf) which is to pull down the voltage of a high level exists in the charging time of a pixel unit in the liquid crystal display panel. A smaller error-proof charging time is better.

Therefore, a problem to be solved is how to minimize the error-proof charging time and improve the tailing when the gate scan signal is pulled down, thereby to increase the charging time.

SUMMARY

The present disclosure provides a shift register, a display panel, and a driving method for a shift register, aiming to assist in charging the quiescent point at the end of the gate scan signal, thereby minimizing the error-proof charging time, improving the tailing, and increasing the charging time.

In an embodiment, the present disclosure provides a shift register, used in a display panel which adopts a gate driver on array technology. The display panel has a plurality of cascaded shift registers. The nth gate shift register is described herein for example, where n is a positive integer greater than 2. The nth shift register receives a previous-stage gate signal and transmits a current-stage gate scan signal Gn to a corresponding nth gate line. The nth shift register has a quiescent point voltage signal Qn. The shift register includes an output circuit and a pull-down feedback circuit.

The output circuit is configured to receive a clock signal and the previous-stage gate signal to generate the gate scan signal, and transmit the gate scan signal to the gate line.

The pull-down feedback circuit having the pull-down feedback feature includes a first switch and a second switch.

The control end of the first switch receives the subsequent-stage quiescent point voltage signal as a feedback signal, to pull down the current-stage quiescent point voltage to the subsequent-stage gate scan signal.

The control end of the second switch receives the subsequent-stage gate scan signal as a feedback signal, to pull down the gate scan signal of the gate line to a low preset level.

In accordance with to the shift register, the display panel, and the driving method for a shift register of the present disclosure, the first switch improved by the pull-down feedback circuit in the shift register can assist in charging the quiescent point at the end of the gate scan signal, which minimizes the error-proof charging time, improves the tailing, and increases the charging time.

DETAILED DESCRIPTION OF THE EMBODIMENTS

A first embodiment of the present disclosure provides a timing controller, which is arranged in a display device. The display device further includes a display panel which uses the Gate Driver on Array technology. A plurality of cascaded gate lines and a plurality of cascaded gate shift registers are arranged in the display panel. In some embodiments, the display panel is, for example, a Liquid Crystal Display (LCD) panel, an Organic Light-Emitting Diode (OLED) display panel, a Quantum Dot Light Emitting Diodes (QLED) display panel, a curved surface display panel, or other display panels.

Figure 1:
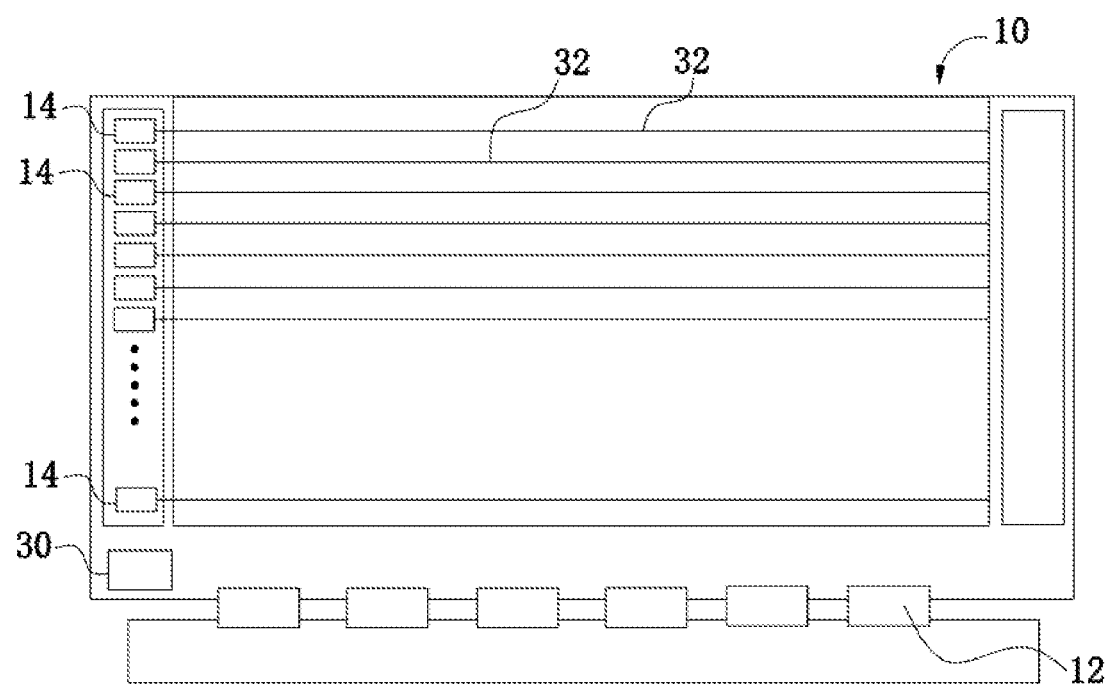
FIG. 1 is a diagram illustrating a display device according to a first embodiment of the present disclosure.

Referring to FIG. 1, FIG. 1 is a diagram illustrating a display device according to a first embodiment of the present disclosure. The display device includes a display panel 10 and a timing controller 30. The display panel 10 using the GOA technology includes a plurality of cascaded gate lines 32. Also a plurality of cascaded gate shift registers 14 are arranged on the display panel. The plurality of the cascaded gate shift registers 14 are coupled to the plurality of the cascaded gate lines 32 respectively.

Although the display panel 10 shown in the figure includes a source driver chip 12, the GOA technology does not use a gate driver chip. Instead, the gate shift registers 14 are directly arranged on the glass substrate. For example, a nth gate shift register 14 generates a gate scan signal Gn of the current stage to drive the nth gate line 32.

The timing controller 30 may be disposed on the substrate or on a circuit board, and electrically coupled to the source driver chip 12 and the gate shift register 14, in order to control the timing of the source driver chip 12 and the gate shift register 14. For example, the timing controller 30 generates a clock signal CKn of the current stage required for the gate shifter 14, so as for the gate shift register 14 to generate a gate scan signal Gn to the gate line 32.

Figure 2:
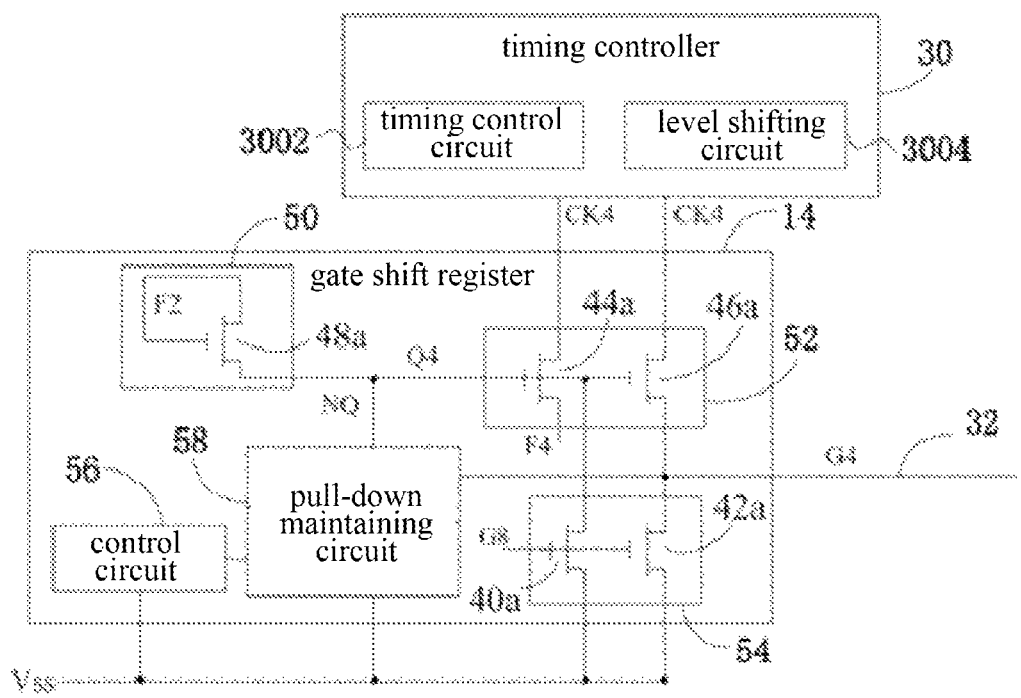
FIG. 2 is a diagram illustrating an association of a timing controller and a gate shift register according to a first embodiment of the present disclosure.

In this embodiment, the timing controller 30 is configured to control the signal required by the gate shift register 14. Referring to FIG. 2, FIG. 2 is a diagram illustrating an association of a timing controller and a gate shift register according to a first embodiment of the present disclosure.

The timing controller 30 includes a timing control circuit 3002 and a level shifting circuit 3004. The gate shift register 14 is configured to receive the gate signal of the previous stage, to generate the gate scan signal of the current stage and the gate signal required for the next stage or the subsequent stage. The gate shift register further includes a pull-down maintaining circuit 58, a control circuit 56, an input circuit 50, an output circuit 52, and a pull-down feedback circuit 54. The input circuit 50, the output circuit 52 and the pull-down maintaining circuit 58 are electrically coupled to an quiescent point NQ. The output circuit 52 is electrically coupled to the timing controller 30, and is electrically coupled to the corresponding gate line 32 along with the pull-down feedback circuit 54 and the pull-down maintaining circuit 58, in order to output the gate scan signal Gn (G4 as shown in the figure, indicating that this gate shift register is a fourth-stage gate shift register). The pull-down feedback circuit 54, the pull-down maintaining circuit 58 and the control circuit 56 receive a low preset level Vss. The control circuit 56 is electrically coupled to the pull-down maintaining circuit 58.

For example, the timing control circuit 3002 is configured to generate the clock signal CKn of the current stage for the nth gate shift register 14, so as for the gate shift register 14 to generate the gate scan signal Gn of the current stage for the gate line 32. As shown in the figure, the timing control circuit 3002 generates the clock signal CK4 for the fourth gate shift register 14, so as for the gate shift register 14 to generate the gate scan signal G4 for the gate line 32. The level shifting circuit 3004 is configured to generate three levels of the clock signal. The three levels are a low preset level, a high level, and a preset lower level, respectively. The high level, the low preset level, and the preset lower level are the three levels in an order from high to low.

The input circuit 50 is configured to receive the gate signal F(n−2) of the second previous stage, and generate an quiescent point voltage signal Qn of the operation point NQ in the gate shift register 14 according to the gate signal F(n−2) of the second previous stage. The quiescent point voltage signal Qn is to be pre-charged to a pre-charge level. As shown in the figure, the gate signal F(n−2) of the second previous stage is F2, the quiescent point voltage signal Qn is Q4, and the clock signal CKn is CK4. The input circuit 50 includes a fifth switch 48a. The fifth switch 48a is configured to receive the gate signal Fn−2 of the second previous stage, and generate the quiescent point voltage signal of the operation point NQ in the gate shift register 14 according to the gate signal of the second previous stage.

The output circuit 52 is configured to receive the clock signal CKn and the pre-charge level, and couple the clock signal CKn with the pre-charge level to the quiescent point voltage signal Qn. As shown in the figure, the quiescent point voltage signal Qn is the quiescent point voltage signal Q4, and the clock signal CKn is the clock signal CK4.

The gate scan signal Gn is then output to the gate line 32, according to the coupled quiescent point voltage signal Qn and the clock signal CKn. As shown in the figure, the gate scan signal G4 is output to the gate line 32 according to the quiescent point voltage signal Q4 and the clock signal CK4. And the output circuit 52 is further configured to generate the gate signal Fn of the current stage (F4 as shown in figure) required for the gate shift register of the second subsequent stage.

In this embodiment, the output circuit 52 includes a third switch 44a and a fourth switch 46a. After receiving the quiescent point voltage signal Qn, a control end of the third switch 44a receives the clock signal CKn and transmits the gate signal Fn required for the gate line 32 of the subsequent stage. A control end of the fourth switch 46a receives the quiescent point voltage signal Qn and the clock signal CKn, and transmits the gate scan signal Gn to the nth gate line 32.

The pull-down feedback circuit 54 is electrically coupled to the gate line 32. After receiving the gate scan signal Gn+4 of the fourth subsequent stage (G8 as shown in the figure), the pull-down feedback circuit 54 pulls down the gate scan signal G4 to the low preset level Vss. The pull-down feedback circuit 54 includes a first switch 40a and a second switch 42a. Control ends of the first switch 40a and the second switch 42a receive the gate scan signal Gn+4 of the fourth subsequent stage, a first end of the first switch 40a receives the quiescent point voltage signal Qn, and a second end of the first switch 40a is electrically coupled to the low preset level Vss. The first switch 40a pulls down the quiescent point voltage Qn to the low preset level Vss according to the gate scan signal Gn+4 of the fourth subsequent stage. A first end of the second switch 42a receives the gate scan signal Gn of the nth gate line 32, and a second end of the second switch 42a receives the low preset level Vss. The second switch 42a pulls down the gate scan signal Gn of the nth gate line 32 to the low preset level Vss according to the gate scan signal Gn+4 of the fourth subsequent stage.

In the process of pulling down the gate scan signal G4, since the clock signal CK4 is at the preset lower level, the gate scan signal G4 is pulled down from the high level to the preset lower level. And because the level difference between the high level and the preset lower level is greater than the level difference between the high level and the low preset level, the gate scan signal G4 can be pulled down more rapidly from the high level to the preset lower level than from the high level to the low preset level. That is to say, by setting the clock signal CK4 at the preset lower level, the gate scan signal G4 can be discharged more rapidly, thus reducing the error-proof charging time.

It should be noted that the first switch 40a, the second switch 42a, the third switch 44a, the fourth switch 46a, and the fifth switch 48a may be transistor switches.

In the present disclosure, the level shifting circuit 3004 generates the three levels of the clock signal, so that when the pull-down feedback circuit 54 pulling down the gate scan signal G4, the discharging can be performed more quickly due to the larger level difference between the high level and the preset lower level in the clock signal, thereby to minimize the error-proof charging time, improve the tailing, as well as increase the charging time.

In addition, the control circuit 56, electrically coupled to the pull-down maintaining circuit 58 and the low preset level Vss, is configured to generate a correct timing to control the pull-down maintaining circuit 58. The pull-down maintaining circuit 58, electrically coupled to the low preset level Vss, is configured to eliminate noise in the quiescent point voltage of the gate shift register 14 under the control of the control circuit 56.

Figure 3:
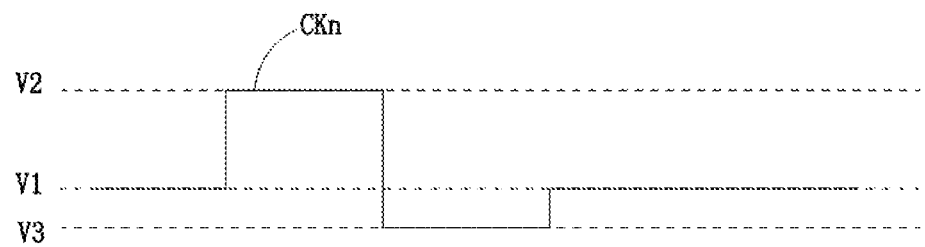
FIG. 3 is a waveform diagram illustrating three levels of the clock signal according to a first embodiment of the present disclosure.

Referring to FIG. 3, FIG. 3 is a waveform diagram illustrating three levels of the clock signal according to a first embodiment of the present disclosure. The three levels are the low preset level V1, the high level V2, and the preset lower level V3. The high level V2, the low preset level V1, and the preset lower level V3 are the three levels in an order from high to low.

The level shifting circuit 3004 generates the low preset level V1 before the clock signal CKn for driving the gate line 32 is generated. In this case, the clock signal CKn is an invalid signal, which is similar to the low preset level Vss. For example, the clock signal CKn is regarded as an invalid clock signal for the gate shift register 14.

The level shifting circuit 3004 generates the high level V2 when the clock signal CKn for driving the gate line 32 is generated. In this case, the clock signal CKn is a valid clock signal for the gate shift register 14, which can be used to trigger the gate shift register 14 to generate the gate scan signal Gn for driving the gate line 32.

The level shifting circuit 3004 generates the preset lower level V3 after the clock signal CKn driving the gate line 32 is generated and at the end of the clock signal CKn. In this way, the level of the clock signal CKn drops down to the preset lower level V3 from the high level V2, so that the level difference of the gate scan signal Gn output to the gate line 32 is larger, which increases the discharging speed and improves the tailing phenomenon. And then the level of the clock signal CKn is raised to the low preset level V1 for the generation of next clock signal.

In an embodiment, since an entire clock signal includes all the three levels, a duty cycle of the high level V2 in the clock signal CKn needs to be less than ⅓, so that during a periodic waveform unit, in addition to the clock signal CKn of the high level V2 and the clock signal of the preset lower level V3, there can be sufficient time for the clock signal CKn of the low preset level V1.

Alternatively, the unit time length of the high level V2 in the clock signal CKn is equal to the unit time length of the lower level V3. In this case, the duty cycle of the high level V2 in the clock signal CKn needs to be less than ⅓. As such, the time length of the low preset level V1 can exceed the aforementioned unit time length, and there can be sufficient time for the low preset level V1.

In the present disclosure, since the level difference between the high level V2 and the preset lower level V3 is larger, the discharging can be performed quickly when pulling down the gate scan signal Gn of the gate line 32, thereby to minimize the error-proof charging time, accordingly improving the tailing and increasing the charging time.

Figure 4:
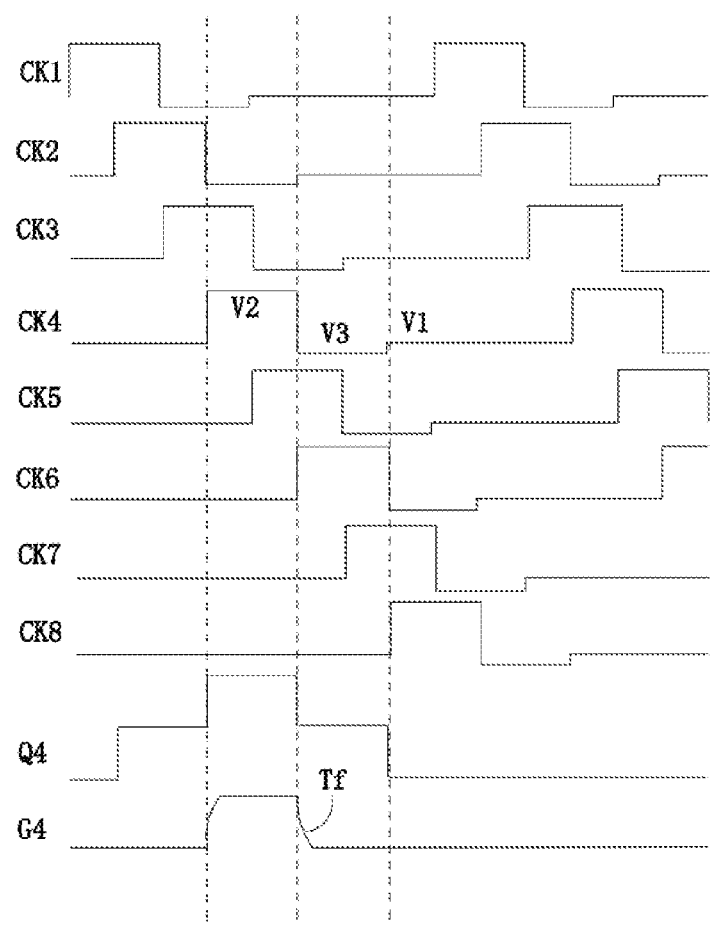
FIG. 4 is a waveform diagram illustrating levels of signals according to a first embodiment of the present disclosure.

Referring to FIG. 4. FIG. 4 is a waveform diagram illustrating levels of signals according to a first embodiment of the present disclosure. Each signal has a different level, and the voltage value of the high level may represent a valid signal. Taking the 8CK clock signal for description, waveforms of the clock signal CK1, CK2, CK3, CK4, CK5, CK6, CK7, and CK8 are as shown in the figure.

Each clock signal has three levels, namely the low preset level V1, the high level V2, and the preset lower level V3. Taking the clock signal CK4 for example, the clock signal CK4 is at the high level V2 which is valid for the gate shift register 14; and then its level is directly pulled down to the preset lower level V3, the larger voltage difference enabling the faster discharging; subsequently, its level returns to the low preset level V1 for the generation of the next clock signal CKn.

The quiescent point voltage signal Q4 has been coupled to an ideal waveform, so as to be smoothly pulled up to the high level, thereby effectively turning the transistor switch on, and smoothly transmitting the gate scan signal G4 to the gate line 32.

However, the gate scan signal G4 is not immediately pulled down to the low preset level V1 from the high level V2 at the end of the gate scan signal G4, thus the gate scan signal G4 is followed by an error-proof charging time Tf, that is, a tailing occurs. In the present disclosure, due to the larger level difference between the high level V2 and the preset lower level V3 in the clock signal CK4, the gate line 32 can be discharged more quickly, which shortens the error-proof charging time Tf, thereby improving the tailing and increasing the charging time.

In addition, another embodiment of the present disclosure provides a display device. The display device includes a display panel 10 and a timing controller 30. The display panel 10 uses the GOA technology. The timing controller 30 includes a timing control circuit 3002 and a level shifting circuit 3004. A plurality of cascaded gate lines 32 and a plurality of cascaded gate shift registers 14 are disposed in the display panel 10. The plurality of the cascaded gate shift registers 14 are coupled to the plurality of the cascaded gate lines 32 respectively. The timing control circuit 3002 generates the clock signal CKn for the nth gate shift register 14, so as for the gate line 32 to generate the gate scan signal Gn. The circuits in the display device may be the corresponding circuits described above, and their operations and effects are substantially the same, thus are not detailed herein.

It should be noted that the duty cycle of the high level V2 in the clock signal CKn is less than ⅓. In particular, on condition that the high level V2 in the clock signal CKn has a unit time length, and the preset lower level V3 also has the same unit time length, that is, when the unit time length of the high level V2 is equal to the unit time length of the preset lower level V3, the duty cycle of the high level V2 needs to be less than ⅓, so that the time length of the low preset level V1 can exceed the unit time length, and there can be sufficient time for the low preset level V1.

In the timing controller, the level shifting circuit, and the method for adjusting the level of the clock signal provided in the present disclosure, the level shifting circuit generates the three levels of the clock signal, so that when the pull-down feedback circuit pulls down the gate scan signal Gn, the gate line can be discharged more quickly due to the larger level difference between the high level and the preset lower level, which minimizes the error-proof charging time, improves the tailing, as well as increases the charging time.

Figure 5:
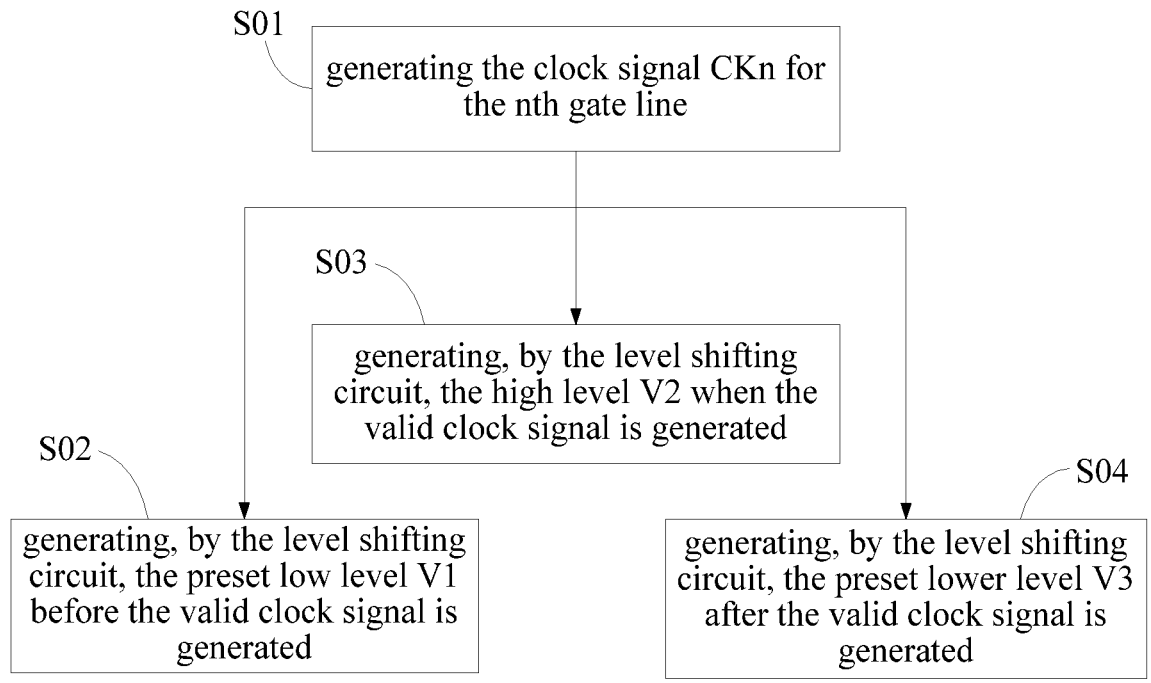
FIG. 5 is a flowchart diagram illustrating a method for adjusting a level according to a first embodiment of the present disclosure.

Referring to FIG. 5. FIG. 5 is a flowchart diagram illustrating a method for adjusting a level according to a first embodiment of the present disclosure. Another embodiment of the present disclosure provides a method for adjusting a level a clock signal, applied in a display device. The display device includes a display panel 10. The display panel 10 using the GOA technology is provided with a plurality of cascaded gate lines 32 and a plurality of cascaded gate shift registers 14. The method includes the following steps:

Step S01, generating a clock signal CKn for a nth gate shift register 14 which is one of a plurality of cascaded gate shift registers 14, so as for the nth gate shift register 14 to generate a gate scan signal Gn for a nth gate line 32.

One of three levels is generated. The three levels are a low preset level V1, a high level V2, and a preset lower level V3. The high level V2, the low preset level V1, and the preset lower level V3 are the three levels in an order from high to low.

Step S02, controlling, by the level shifting circuit 3004, the level of the clock signal to generate the low preset level V1, before the clock signal CKn configured to drive the nth gate line 32 is generated.

Step S03, controlling, by the level shifting circuit 3004, the level of the clock signal to generate the high level V2, when the clock signal CKn configured to drive the nth gate line 32 is generated.

Step S04, controlling, by the level shifting circuit 3004, the level of the clock signal to generate the preset lower level V3, after the clock signal CKn configured to drive the nth gate line 32 is generated. The level of the signal is then raised to the low preset level V1 for the generation of the next clock signal.

As the high level V2 in step S03 drops down to the preset lower level V3 in step S04, the level difference between the high level V2 and the preset lower level V3 is larger than the level difference between the high level V2 and the low preset level V1, so that the gate line 32 can be discharged more quickly, which reduces the error-proof charging time, thereby effectively improving the tailing.

To sum up, in the timing controller 30, the display device, and the method for adjusting the level of the clock signal provided in the present disclosure, the level shifting circuit 3004 generates the three levels of the clock signal, so that when the gate scan signal Gn is pulled down, the gate line 32 can be discharged more quickly due to the larger level difference between the high level V2 and the preset lower level V3 in the clock signal CKn, which minimizes the error-proof charging time, improves the tailing of the gate scan signal Gn, as well as increases the charging time.

Figure 6:
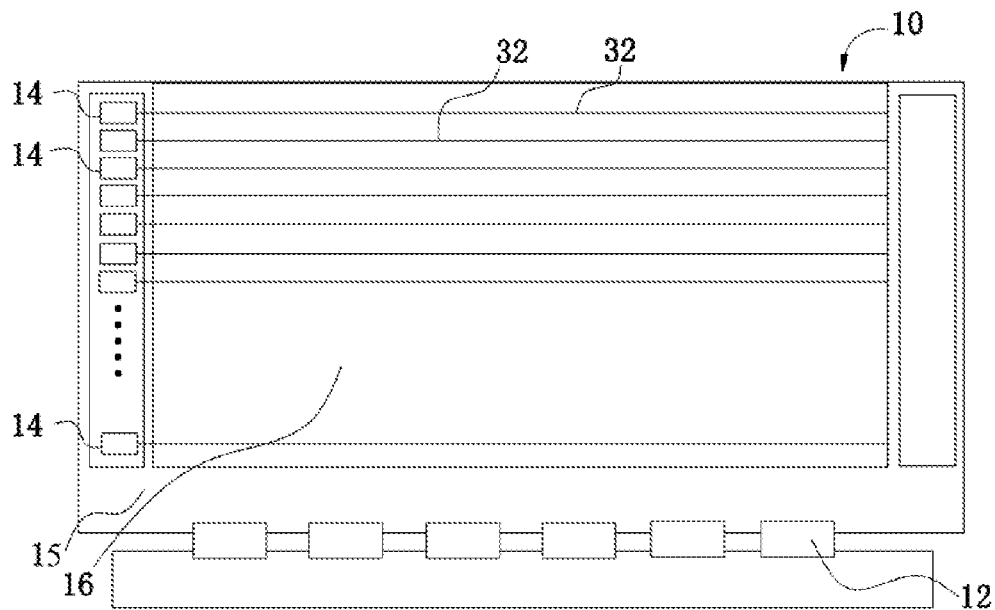
FIG. 6 is a diagram illustrating a display device according to a second embodiment of the present disclosure.

Referring to FIG. 6. FIG. 6 is a diagram illustrating a display device according to a second embodiment of the present disclosure. The shift register 14 in this embodiment is arranged in a display panel 10 using the GOA technology. The display panel 10 includes a substrate 15, a display area structure 16, a plurality of gate lines 32, and a plurality of cascaded shift registers 14. The display area structure 16 is disposed on the substrate 15. The plurality of the gate lines 32 are disposed on the substrate 15 and extend into the display area structure 16. The plurality of the shift registers 14 are disposed on the substrate 15 and adjacent to the display area structure 16, and electrically coupled to the plurality of the gate lines 32, respectively. Further, the display area structure 16 may include pixel units (not shown) arranged in a matrix, and active switches (not shown) are disposed in the pixel unit. The gate lines 32 extend to the plurality of the pixel units, and coupled with the active switches.

Although the display panel 10 shown in the figure includes a source driver chip 12, the GOA technology does not use a gate driver chip. Instead, the gate shift registers 14 are directly arranged on the glass substrate. Each of the gate shift registers 14 receives a gate signal of the previous stage, and transmits a gate scan signal through the gate line 32.

Figure 7:
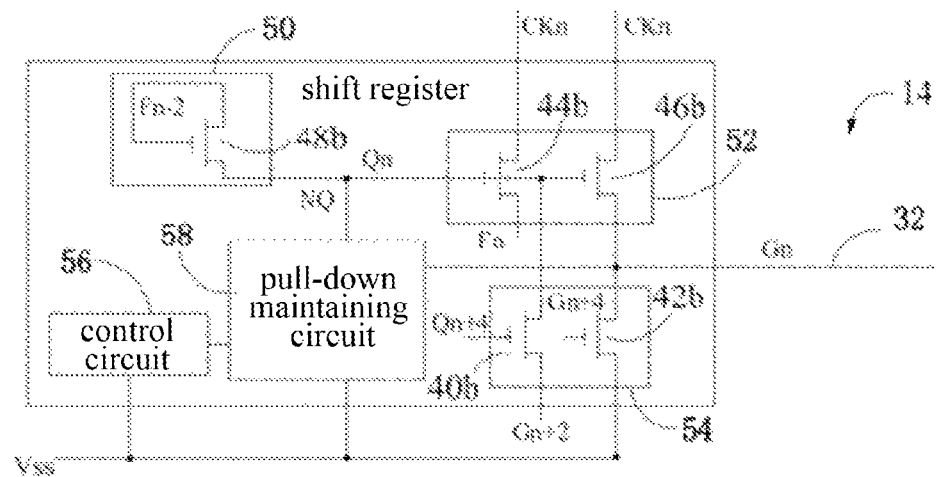
FIG. 7 is a diagram illustrating a shift register according to a second embodiment of the present disclosure.

FIG. 7 is a diagram illustrating a shift register according to an embodiment. Taking the nth cascaded shift register 14 for description, n is a positive integer greater than 2, and the nth shift register 14 receives the gate signal Fn−2 of the second previous stage, so as to transmit the gate scan signal Gn through the nth gate line 32. The quiescent point NQ in the nth shift register 14 has a quiescent point voltage signal Qn. The circuit connections and operations of the nth shift register 14 in this embodiment are substantially the same as those in the embodiment as shown in FIG. 2, thus are not detailed herein. Different from the embodiment as shown in FIG. 2, the pull-down feedback circuit 54 in this embodiment receives the gate scan signal Gn+4 of the fourth subsequent stage, also receives the quiescent point voltage signal Qn+4 of the fourth subsequent stage and the gate scan signal Gn+2 of the second subsequent stage.

As shown is an embodiment of an eight-stage clock signal, in order to generate the gate scan signal Gn for the nth gate line 32, the shift register 14 receives the gate signal Fn−2 of the second previous stage and the clock signal CKn of the current stage, to generate the quiescent point voltage signal Qn and the gate scan signal Gn.

However, the generated clock signal CKn will charge the gate line 32 to generate the gate scan signal Gn, and the gate scan signal Gn is pulled down from the high level to the low level Vss at the end of the gate scan signal Gn. At this time, in the transistor switch, an end of the gate scan signal Gn is performing the discharging on an end of the clock signal CKn, and the waveform of the gate scan signal Gn is not pulled down immediately, thus there is the error-proof charging time Tf, namely the so-called tailing occurs.

In this embodiment, the tailing can be improved by using the shift register 14. The input circuit 50 in the shift register 14 is configured to receive the gate signal Fn−2 of the second previous stage, and generate the quiescent point voltage of the quiescent point NQ in the shift register 14 according to the gate signal Fn−2 of the second previous stage.

The input circuit 50 includes a fifth switch 48b. The fifth switch 48b is configured to receive the gate signal Fn−2 of the second previous stage, and generate the quiescent point voltage of the shift register 14 according to the gate signal Fn−2 of the second previous stage.

The quiescent point voltage from the input circuit 50 is precharged, and the precharged quiescent point voltage is coupled with the clock signal CKn to the quiescent point voltage signal Qn. The output circuit 52 is configured to receive the clock signal CKn and the quiescent point voltage signal Qn, to generate the gate signal Fn required for the subsequent shift register 14, and generate the gate scan signal Gn required for the gate line 32.

The output circuit 52 includes a third switch 44b and a fourth switch 46b. After receiving the quiescent point voltage signal Qn, a control end of the third switch 44b receives the clock signal CKn and transmits the gate signal Fn required for the subsequent gate line 32. After receiving the quiescent point voltage signal Qn, a control end of the fourth switch 46*b* receives the clock signal CKn, and transmits the gate scan signal Gn to the nth gate line 32.

The pull-down feedback circuit 54 having the pull-down feedback feature includes a first switch 40*b* and a second switch 42*b*. A control end of the first switch 40*b* receives the quiescent point voltage signal Qn+4 of the fourth subsequent stage, a first end of the first switch 40*b* receives the quiescent point voltage signal Qn, and a second end of the first switch 40*b* receives the gate scan signal Gn+2 of the second subsequent stage. A control end of the second switch 42*b* receives the quiescent point voltage signal Qn+4 of the fourth subsequent stage as a feedback signal, so as to pull down the quiescent point voltage signal Qn to the gate scan signal Gn+2 of the second subsequent stage.

The control end of the second switch 42*b* receives the gate scan signal Gn+4 of the fourth subsequent stage, the first end of the second switch 42*b* receives the gate scan signal Gn of the nth gate line 32, and the second end of the second switch 42*b* receives the low preset level Vss. The control end of the second switch 42*b* receives the gate scan signal Gn+4 of the fourth subsequent stage as a feedback signal, so as to pull down the gate scan signal Gn of the nth gate line 32 to the low preset level Vss.

The first switch 40*b* uses the quiescent point voltage signal Qn+4 instead of the gate scan signal Gn+4 as the control end signal, and the level is pulled down to level of the gate scan signal Gn+2 instead of the low preset level Vss. Therefore, the first switch 40*b* improved by the pull-down feedback circuit 54 in the shift register 14 can assist the charging of the quiescent point NQ to maintain or raise the level of the quiescent point NQ, thereby minimizing the error-proof charging time, improving the tailing, as well as increasing the charging time.

It should be noted that the above first switch 40*b*, the second switch 42*b*, the third switch 44*b*, the fourth switch 46*b*, and the fifth switch 48*b* may be transistor switches.

In addition, the display panel 10 shown in FIG. 6 may use the shift register provided in the foregoing embodiments, and its operation manner has been described above, thus are not detailed herein.

Figure 8:
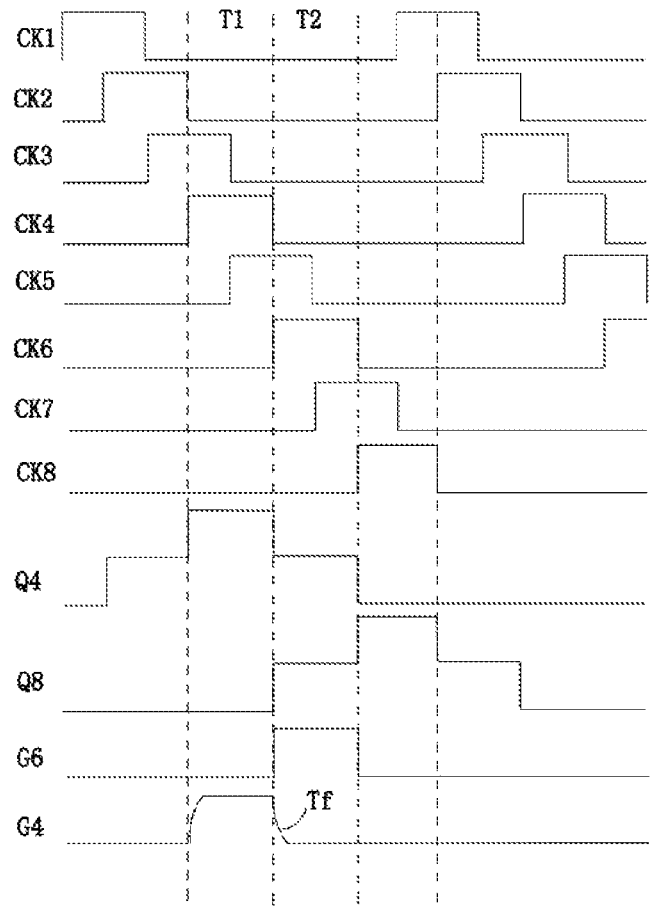
FIG. 8 is a waveform diagram illustrating levels of signals according to a second embodiment of the present disclosure.

Referring to FIG. 8. FIG. 8 is a waveform diagram illustrating levels of signals according to a second embodiment of the present disclosure. Each signal has a different level, and the voltage value of the high level represents a valid signal. Taking the 8CK clock signal for example, waveforms of the clock signal CK1, CK2, CK3, CK4, CK5, CK6, CK7, and CK8 are as shown in the figure.

In an embodiment of the shift register 14 with n=4, the quiescent point voltage signal Q4 has been coupled with the clock signal CK4 into an ideal waveform, so that the precharged quiescent point voltage signal can be smoothly pulled up to the high level, thereby to effectively turn on the transistor switch, and transmit the gate scan signal G4 to the gate line 32.

The quiescent point voltage signal Q8 is generated at the control end of the first switch 40*b*, so that the quiescent point voltage signal Q4 can be pulled down to the waveform of the gate scan signal G6, thereby to form an ideal waveform of the quiescent point voltage signal Q4. In addition, the gate scan signal Gn8 is generated at the control end of the second switch 42*b*, so that the quiescent point voltage signal Q4 and the gate scan signal G4 can be pulled down to the low preset level Vss, thereby to completely end the quiescent point voltage signal Q4.

However, the gate scan signal G4 is generated based on the high level of the clock signal CK4. The gate line 32 is charged to the gate scan signal G4 by the first end of the fourth switch 46*b* to the second end of the fourth switch 46*b*. The clock signal CK4 is changed to the low level from the high level at the end of the gate scan signal G4. At this time, the second end of the fourth switch 46*b* performs the discharging on the first end, which brings the error-proof charging time Tf in the gate scan signal G4, thereby resulting in the tailing.

In this embodiment, the first switch 40*b* can charge the quiescent point during the timing unit T2, which helps to increase the driving signal (VGS) during the timing unit T2, thereby improving the tailing. It should be noted that the higher the voltage level indicated by the waveform of the quiescent point voltage signal Q4 during the above-mentioned timing unit T2, the better. This means that the greater the driving signal is, the stronger the charging ability is, which is more helpful to improve the tailing of the clock signal CK4.

Figure 9:
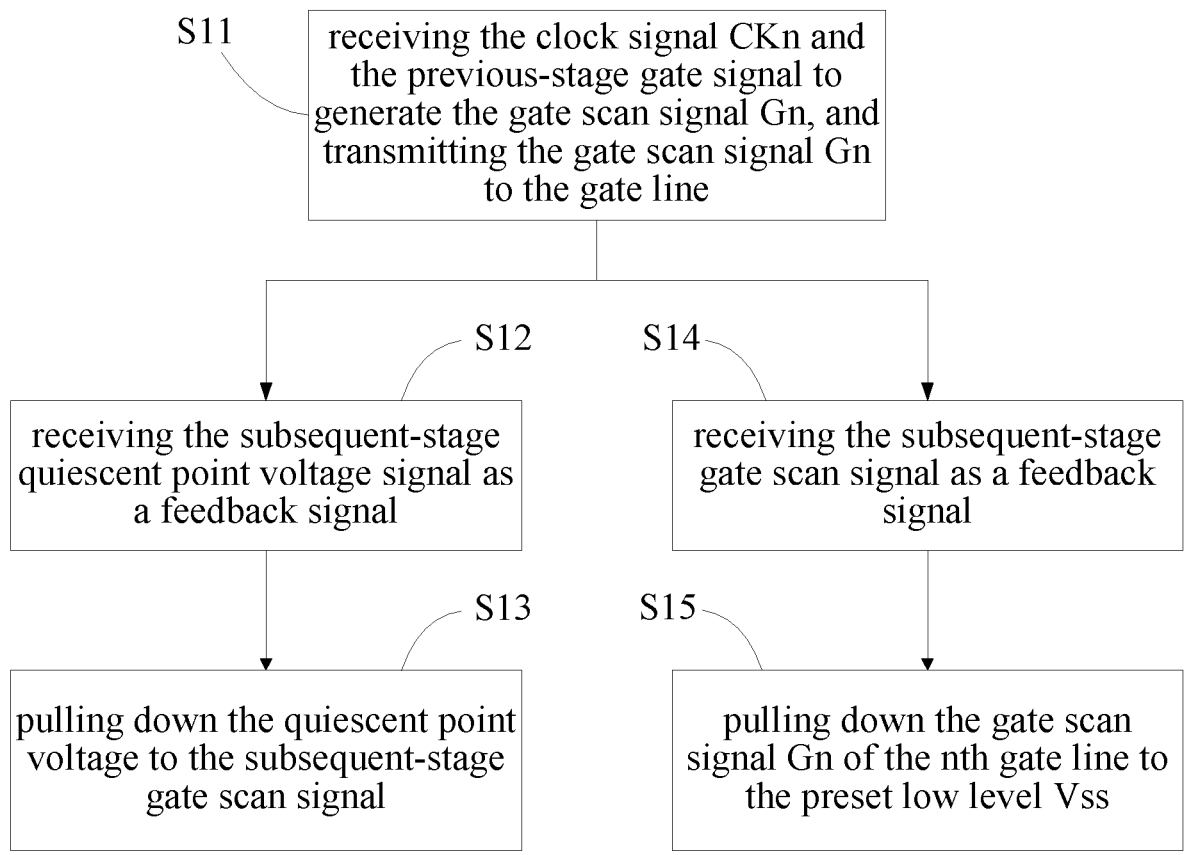
FIG. 9 is a flowchart diagram illustrating a driving method according to a second embodiment of the present disclosure.

Referring to FIG. 9. FIG. 9 is a flowchart diagram illustrating a driving method according to a second embodiment of the present disclosure. The driving method is applied in the display panel 10 using the GOA technology as shown in FIG. 6, and the display panel 10 has a plurality of cascaded shift registers 14. Taking the nth shift register 14 for example, the "n" is a positive integer greater than 2, and the nth shift register 14 receives the gate signal of the previous stage, to transmit the gate scan signal Gn through the nth gate line 32. The nth shift register 14 has a quiescent point voltage signal Qn. The driving method includes the following steps:

Step S11, receiving the clock signal CKn and the gate signal of the previous second stage, to generate the gate scan signal Gn, and transmitting the gate scan signal Gn to the gate line 32.

Step S12, receiving the quiescent point voltage signal of the subsequent fourth stage as a feedback signal.

Step S13, pulling down the level of the quiescent point voltage to the level of the gate scan signal of the subsequent second stage.

Step S14, receiving the gate scan signal of the subsequent fourth stage as a feedback signal.

Step S15, pulling down the level of the gate scan signal Gn of the nth gate line 32 to the low preset level Vss.

Figure 10:
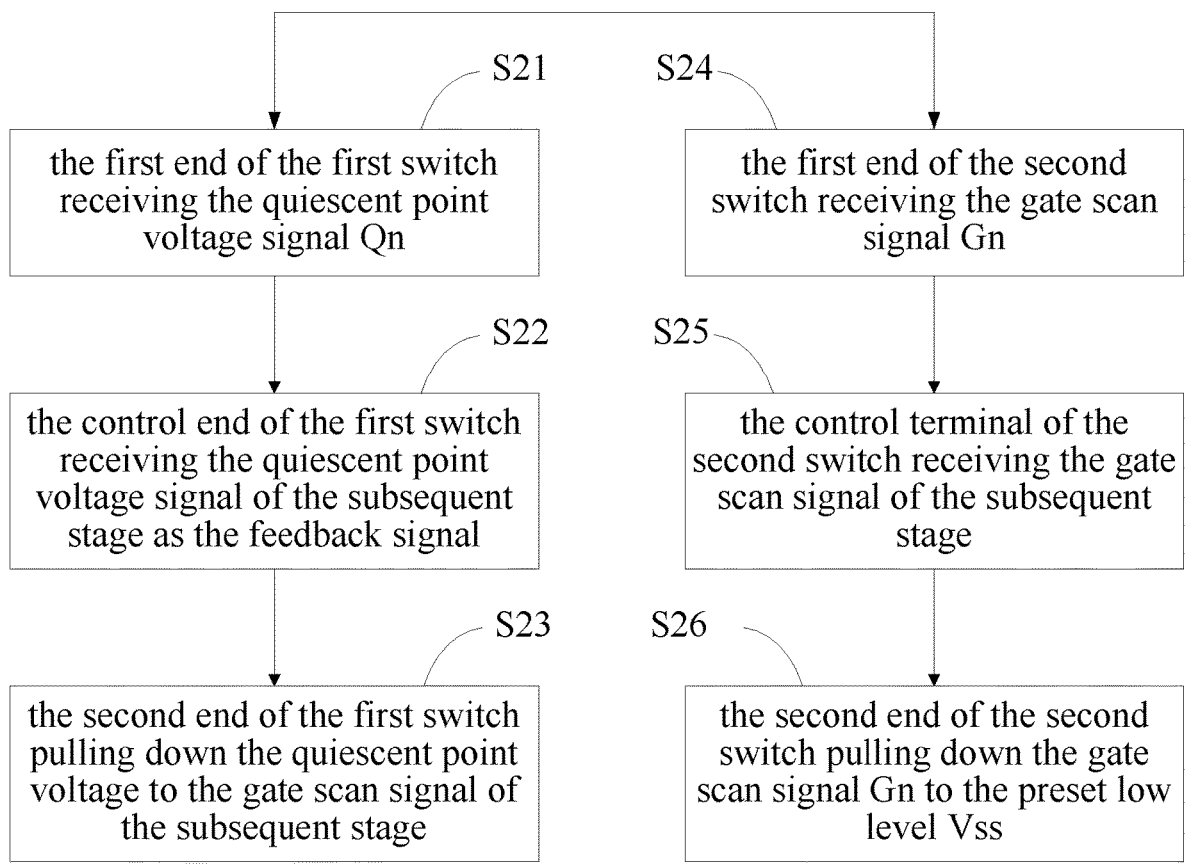
FIG. 10 is a flowchart diagram further illustrating the driving method shown in FIG. 9.

Referring to FIG. 10, FIG. 10 is a flowchart diagram illustrating an improved embodiment of the driving method shown in FIG. 9. According to the above driving method, the shift register 14 includes the first switch 40*b* and the second switch 42*b*. The first switch 40*b* and the second switch 42*b* each includes the control end, the first end, and the second end. The driving method includes the following steps:

Step S21, the first end of the first switch 40*b* receives the quiescent point voltage signal Qn. Step S22, the control end of the first switch 40*b* receives the quiescent point voltage signal of the subsequent shift register, for example, the shift register of the fourth subsequent stage, and uses the quiescent point voltage as the feedback signal. Step S23, the second end of the first switch 40*b* pulls down the quiescent point voltage to the gate scan signal of the subsequent shifter register, for example, the shift register of the second subsequent stage. The steps S21, S22, and S23 implement the steps S12 and S13 shown in FIG. 9. Step S24, the first end of the second switch 42 receives the gate scan signal Gn. Step S25, the control terminal of the second switch 42*b* receives the gate scan signal of the subsequent shift register, for example, the shift register of the fourth subsequent stage, as the feedback signal. Step S26, the second end of the second switch 42*b* pulls down the gate scan signal Gn to the low preset level Vss.

The steps S24, S25, and S26 implement the steps S14 and S15 shown in FIG. 9.

In this embodiment, the first switch 40*b* uses the quiescent point voltage signal of the subsequent stage as the control end signal instead of using the gate scan signal of the subsequent stage, and the level is pulled down to the level of the gate scan signal of another subsequent stage instead of the low preset level Vss. Therefore, the first switch 40*b* improved by the pull-down feedback circuit 54 in the shift register 14 can assist in charging the quiescent point at the end of the gate scan signal Gn, which minimizes the error-proof charging time, improves the tailing, as well as increases the charging time.

To sum up, the first switch 40*b* uses the quiescent point voltage signal of the subsequent stage as the control end signal, and the level is pulled down to the level of the gate scan signal of another subsequent stage. Therefore, the first switch improved by the pull-down feedback circuit in the shift register can assist in charging the quiescent point at the end of the gate scan signal, which minimizes the error-proof charging time, improves the tailing, as well as increases the charging time.

Although the signals used in the present disclosure are associated with the second shift register before the current one, the second shift register after the current one, and the fourth shift register after the current one, they are not intended to limit the scope of the present disclosure. It can be understood that the shift registers of another stages can also be used, as long as the corresponding levels can be satisfied.

It should be noted that each step involved in the present disclosure is not determined to limit the sequence of steps without affecting the implementation. The steps written in previous positions may be performed first, or performed later, or even simultaneously. All the technical solutions that can be implemented should be considered as the scope of protection of the present disclosure.

The foregoing are only illustrative embodiments in accordance with the present disclosure and therefore not intended to limit the patentable scope of the present disclosure. Any equivalent structure or flow transformations that are made taking advantage of the specification and accompanying drawings of the disclosure and any direct or indirect applications thereof in other related technical fields are within the protection scope of the present disclosure.

What is claimed is:

1. A shift register, applied in a display panel in which gate driver on array is used, the display panel comprising a plurality of cascaded shift registers, the shift register being configured to receive a previous-stage gate signal and transmit a gate scan signal to a gate line, the shift register having a quiescent point voltage signal;
   wherein the shift register comprises:
   an output circuit, configured to receive a clock signal and the previous-stage gate signal to generate the gate scan signal, and transmit the gate scan signal to the gate line; and
   a pull-down feedback circuit, comprising a first switch and a second switch;
   wherein a control end of the first switch is configured to receive a subsequent-stage quiescent point voltage signal as a feedback signal, to pull down a current-stage quiescent point voltage to a subsequent-stage gate scan signal; and
   a control end of the second switch is configured to receive the subsequent-stage gate scan signal as a feedback signal, to pull down the gate scan signal of the gate line to a low preset level.

2. The shift register of claim 1, wherein the output circuit further comprises a third switch and a fourth switch;
   a control end of the third switch is configured to receive the clock signal and transmit a gate signal required for a subsequent-stage gate line after receiving the quiescent point voltage signal; a control end of the fourth switch is configured to receive the clock signal and transmit the gate scan signal to the gate line after receiving the quiescent point voltage signal.

3. The shift register of claim 1, wherein the shift register further comprises a fifth switch;
   the fifth switch is configured to receive the previous-stage gate signal, and generate the quiescent point voltage of the shift register according to the previous-stage gate signal.

4. The shift register of claim 1, wherein a first end of the first switch is electrically coupled to the quiescent point voltage signal, a second end of the first switch is electrically coupled to the subsequent-stage gate scan signal; a first end of the second switch is electrically coupled to the gate scan signal of the gate line, and a second end of the second switch is electrically coupled to the low preset level.

5. The shift register of claim 4, wherein the shift register has an eight-stage clock signal; the subsequent-stage quiescent point voltage signal electrically coupled to the control end of the first switch is a subsequent-fourth-stage quiescent point voltage signal, the subsequent-stage gate scan signal electrically coupled to the control end of the second switch is a subsequent-fourth-stage gate scan signal, and the subsequent-stage gate scan signal electrically coupled to the second end of the first switch is a subsequent-second-stage gate scan signal.

6. The shift register of claim 1, wherein the output circuit further comprises a third switch and a fourth switch;
   a control end of the third switch is configured to receive the clock signal and transmit a gate signal required for a subsequent-stage gate line after receiving the quiescent point voltage signal; a control end of the fourth switch is configured to receive the clock signal and transmit the gate scan signal to the gate line after receiving the quiescent point voltage signal;
   the shift register further comprises a fifth switch; the fifth switch is configured to receive the previous-stage gate signal, and generate the quiescent point voltage of the shift register according to the previous-stage gate signal.

7. The shift register of claim 1, wherein the output circuit further comprises a third switch and a fourth switch;
   a control end of the third switch is configured to receive the clock signal and transmit a gate signal required for a subsequent-stage gate line after receiving the quiescent point voltage signal; a control end of the fourth switch is configured to receive the clock signal and transmit the gate scan signal to the gate line after receiving the quiescent point voltage signal;
   a first end of the first switch is electrically coupled to the quiescent point voltage signal, a second end of the first switch is electrically coupled to the subsequent-stage gate scan signal; a first end of the second switch is electrically coupled to the gate scan signal of the gate line, and a second end of the second switch is electrically coupled to the low preset level.

8. The shift register of claim 7, wherein the shift register has an eight-stage clock signal; the subsequent-stage quiescent point voltage signal electrically coupled to the control end of the first switch is a subsequent-fourth-stage quiescent point voltage signal, the subsequent-stage gate scan signal electrically coupled to the control end of the second switch is a subsequent-fourth-stage gate scan signal, and the subsequent-stage gate scan signal electrically coupled to the second end of the first switch is a subsequent-second-stage gate scan signal.

9. The shift register of claim 1, wherein the shift register further comprises a fifth switch, the fifth switch is configured to receive the previous-stage gate signal, and generate the quiescent point voltage of the shift register according to the previous-stage gate signal;
- a first end of the first switch is electrically coupled to the quiescent point voltage signal, a second end of the first switch is electrically coupled to the subsequent-stage gate scan signal; a first end of the second switch is electrically coupled to the gate scan signal of the gate line, and a second end of the second switch is electrically coupled to the low preset level.

10. The shift register of claim 9, wherein the shift register has an eight-stage clock signal; the subsequent-stage quiescent point voltage signal electrically coupled to the control end of the first switch is a subsequent-fourth-stage quiescent point voltage signal, the subsequent-stage gate scan signal electrically coupled to the control end of the second switch is a subsequent-fourth-stage gate scan signal, and the subsequent-stage gate scan signal electrically coupled to the second end of the first switch is a subsequent-second-stage gate scan signal.

11. The shift register of claim 1, wherein the output circuit further comprises a third switch and a fourth switch;
- a control end of the third switch is configured to receive the clock signal and transmit a gate signal required for a subsequent-stage gate line after receiving the quiescent point voltage signal; a control end of the fourth switch is configured to receive the clock signal and transmit the gate scan signal to the gate line after receiving the quiescent point voltage signal;
- the shift register further comprises a fifth switch, the fifth switch is configured to receive the previous-stage gate signal, and generate the quiescent point voltage of the shift register according to the previous-stage gate signal;
- a first end of the first switch is electrically coupled to the quiescent point voltage signal, a second end of the first switch is electrically coupled to the subsequent-stage gate scan signal; a first end of the second switch is electrically coupled to the gate scan signal of the gate line, and a second end of the second switch is electrically coupled to the low preset level.

12. The shift register of claim 11, wherein the shift register has an eight-stage clock signal; the subsequent-stage quiescent point voltage signal electrically coupled to the control end of the first switch is a subsequent-fourth-stage quiescent point voltage signal, the subsequent-stage gate scan signal electrically coupled to the control end of the second switch is a subsequent-fourth-stage gate scan signal, and the subsequent-stage gate scan signal electrically coupled to the second end of the first switch is a subsequent-second-stage gate scan signal.

13. A display panel, comprising:
- a substrate, provided with a plurality of pixel units and a plurality of active switches corresponding to the plurality of pixel units;
- a plurality of gate lines, arranged on the substrate and extending to the plurality of the pixel units;
- a plurality of cascaded shift registers, arranged on the substrate, electrically coupled to the plurality of the gate lines respectively, the shift register being configured to receive a previous-stage gate signal and transmitting a gate scan signal through the gate line, the shift register having a quiescent point voltage signal, the shift register comprising a pull-down feedback circuit;
- wherein the pull-down feedback circuit comprises:
  - a first switch, a control end of the first switch being configured to receive a subsequent-stage quiescent point voltage signal as a feedback signal, to pull down the quiescent point voltage to a subsequent-stage gate scan signal; and
  - a second switch, a control end of the second switch being configured to receive the subsequent-stage gate scan signal as a feedback signal, to pull down the gate scan signal of the gate line to a low preset level.

14. The display panel of claim 13, wherein a first end of the first switch is electrically coupled to the quiescent point voltage signal, a second end of the first switch is electrically coupled to the subsequent-stage gate scan signal; a first end of the second switch is electrically coupled to the gate scan signal of the gate line, and a second end of the second switch is electrically coupled to the low preset level.

15. The display panel of claim 14, wherein the shift register has an eight-stage clock signal, the subsequent-stage quiescent point voltage signal electrically coupled to the control end of the first switch is a subsequent-fourth-stage quiescent point voltage signal, the subsequent-stage gate scan signal electrically coupled to the control end of the second switch is a subsequent-fourth-stage gate scan signal, and the subsequent-stage gate scan signal electrically coupled to the second end of the first switch is a subsequent-second-stage gate scan signal.

16. A driving method for a shift register, applied in a display panel in which gate driver on array is used, the display panel comprising a plurality of cascaded shift registers, the shift register being configured to receive a previous-stage gate signal and transmit a gate scan signal to a gate line, the shift register having a quiescent point voltage signal;
- wherein the driving method comprises the following steps:
  - receiving a clock signal and a previous-stage gate signal to generate a gate scan signal, and transmitting the gate scan signal to a gate line;
  - receiving a subsequent-stage quiescent point voltage signal as a feedback signal;
  - pulling down the quiescent point voltage to a subsequent-stage gate scan signal;
  - receiving the subsequent-stage gate scan signal as a feedback signal; and
  - pulling down the gate scan signal of the gate line to a low preset level.

17. The driving method of claim 16, wherein the shift register comprises a first switch and a second switch, the first switch and the second switch each comprises a control end, a first end, and a second end;
- wherein the driving method further comprises the following steps:
  - receiving, by a first end of the first switch, the quiescent point voltage signal;
  - receiving, by a control end of the first switch, the subsequent-stage quiescent point voltage signal as the feedback signal;

pulling down, by a second end of the first switch, the quiescent point voltage to the subsequent-stage gate scan signal;
receiving, by a first end of the second switch, the gate scan signal;
receiving, by a control end of the second switch, the subsequent-stage gate scan signal as the feedback signal; and
pulling down, by a second end of the second switch, the gate scan signal to the low preset level.

* * * * *